US010386486B2

(12) United States Patent
Price et al.

(10) Patent No.: US 10,386,486 B2
(45) Date of Patent: Aug. 20, 2019

(54) SYSTEMS AND METHODS FOR TIME OF FLIGHT LASER PULSE ENGINEERING

(71) Applicant: Microsoft Technology Licensing, LLC, Redmond, WA (US)

(72) Inventors: Raymond Kirk Price, Redmond, WA (US); Ravi Kiran Nalla, San Jose, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 453 days.

(21) Appl. No.: 15/188,219

(22) Filed: Jun. 21, 2016

(65) Prior Publication Data

US 2017/0363742 A1 Dec. 21, 2017

(51) Int. Cl.
*G01C 3/08* (2006.01)
*G01S 17/89* (2006.01)
*H01S 5/00* (2006.01)
*G01S 7/481* (2006.01)
*H01S 5/40* (2006.01)

(52) U.S. Cl.
CPC ............ *G01S 17/89* (2013.01); *G01S 7/4816* (2013.01); *H01S 5/005* (2013.01); *H01S 5/0014* (2013.01); *H01S 5/4018* (2013.01); *H01S 5/4031* (2013.01); *H01S 5/4043* (2013.01)

(58) Field of Classification Search
CPC ...... G01S 17/89; G01S 7/4816; H01S 5/0014; H01S 5/005; H01S 5/4043; H01S 5/4018; H01S 5/4031
USPC ........................................................ 356/5.01
See application file for complete search history.

(56) References Cited

U.S. PATENT DOCUMENTS

| 8,320,621 | B2 | 11/2012 | McEldowney |
| 8,330,822 | B2 | 12/2012 | McEldowney et al. |
| 8,670,029 | B2 | 3/2014 | McEldowney |
| 8,681,255 | B2 | 3/2014 | Katz et al. |
| 8,958,448 | B2 | 2/2015 | Canumalla et al. |
| 9,134,114 | B2 | 9/2015 | Metz et al. |
| 9,641,825 | B2 * | 5/2017 | Pelman ............... G01S 17/89 |
| 2005/0031005 | A1 | 2/2005 | Cheng et al. |
| 2006/0214121 | A1 | 9/2006 | Schrey et al. |
| 2008/0186470 | A1 | 8/2008 | Hipp |
| 2010/0212729 | A1 | 8/2010 | Hsu |
| 2012/0268727 | A1 | 10/2012 | Schrey et al. |
| 2013/0050425 | A1 | 2/2013 | Im et al. |
| 2014/0104592 | A1 | 4/2014 | Tien |
| 2014/0267631 | A1 | 9/2014 | Powers et al. |
| 2015/0229912 | A1 | 8/2015 | Masalkar et al. |
| 2015/0255960 | A1 | 9/2015 | Kanskar |

(Continued)

OTHER PUBLICATIONS

Boucher, et al., "Ultra high efficiency 1550nm multi-junction pulsed laser diodes", In Proceedings of SPIE—the International Society for Optical Engineering, vol. 7480, Sep. 2009, 12 pages.

(Continued)

*Primary Examiner* — Mark Hellner
(74) *Attorney, Agent, or Firm* — Workman Nydegger

(57) ABSTRACT

A time-of-flight 3D imaging system includes a light source having a plurality of P-N junctions in electrical series, an imaging sensor, and a time measurement device configured to measure the elapsed time-of-flight between a pulse of output light being emitted from the plurality of P-N junctions in series and incoming light including the pulse of output light being detected at the imaging sensor.

20 Claims, 6 Drawing Sheets

(56) References Cited

U.S. PATENT DOCUMENTS

2015/0312554 A1    10/2015    Banks et al.
2016/0341664 A1*  11/2016    Rothberg ........... G01N 21/6408
2017/0187164 A1*   6/2017    Thompson ............ H01S 5/0651

OTHER PUBLICATIONS

Ghazai, et al., "Effect of Cavity Length and Operating Parameters on the Optical Performance of AI0.08In0.08Ga0.84N/ AI0.1In0.01Ga0.89N MQW Laser Diodes", In Publication of Intech, Apr. 25, 2012, 11 pages.

Hardesty, Larry , "3-D Cameras for Cellphones" Published on: Jan. 5, 2012 Available at: http://news.mit.edu/2011/lidar-3d-camera-cellphones-0105.

"High power Multi-junction Pulsed Laser Diode", Retrieved on: Mar. 15, 2016, Available at: https://www.lasercomponents.com/de/?embedded=1&file=fileadmin/user_upload/home/Datasheets/lcc/905d1s3j0xx.pdf&no_cache=1.

Ko, et al., "Cavity length and temperature dependent characteristics of compressively strained InGaAsP MQW BH lasers with a two-step compositional SCH structure", In Semiconductor Science and Technology, vol. 23, Issue 9, Aug. 12, 2008, 8 pages.

Pragyan, "Microsoft Hololens—A New World", Published on: May 4, 2015 Available at: https://www.pragyan.org/blog/2015/05/microsoft-hololens-a-new-world-2/.

Reeb, Winfried, "Drive Electronics for Pulsed Laser Diodes Power where it Matters", Retrieved on: Mar. 15, 2016, Available at: https://www.lasercomponents.com/de/?embedded=1&file=fileadmin/user_upload/home/Datasheets/lc/applikationsreport/drive-electronics-pulsed-laser-diodes.pdf&no_cache=1.

Slipchenko, et al., "Dynamic model of pulsed laser generators based on multi-junction N-p-N-i-P heterostructures", In Proceedings of SPIE, Physics and Simulation of Optoelectronic Devices, vol. 9742, Mar. 4, 2016, 2 pages.

Wolff, Detlev, "Lasers & Sources Powering Up", In Proceedings of SPIE, Jan. 31, 2006, 3 pages.

* cited by examiner

SYSTEMS AND METHODS FOR TIME OF FLIGHT LASER PULSE ENGINEERING

CROSS-REFERENCE TO RELATED APPLICATIONS

N/A

BACKGROUND

Background and Relevant Art

Three-dimensional (3D) imaging systems are configured to identify and map a target based on light that is reflected from the target. Many of these imaging systems are configured with a light source that is configured to emit light towards the target and with a photoreceptor to receive the light after it is reflected back from the target.

Some imaging systems (e.g., structured light systems) measure the distortion or displacement of light patterns to measure the shapes, surfaces and distances of the target objects. For instance, light may be emitted as a structured pattern, such as a grid pattern, dot pattern, line pattern, etc., towards the target environment. Then, the photoreceptor receives light that is reflected back from the target objects which is also patterned and which is correlated against the known initial pattern to calculate the distances, shapes, and positions of the objects in the target environment.

Other imaging systems (i.e., time-of-flight imaging systems) are capable of identifying the distances and positions of objects within a target environment by measuring the elapsed time between the emission of light from the light source and the reception of the light that is reflected off of the objects.

However, precise measurement of the elapsed time of flight may be compromised by contamination by ambient light. For example, objects that are far away can reflect light at a much lower intensity than close objects. Additionally, brightly illuminated environments, such as outdoor environments during daylight, can also introduce noise through ambient light. Increasing the intensity of the light source in a conventional time-of-flight imaging system may introduce complications including increased power consumption and thermal degradation of the light source. Additionally, traditional time of flight 3D imaging systems rely on a series of nanosecond laser pulses to acquire a sufficient signal for an adequate signal to noise ratio. The high quantity of laser pulses and associated high quantity of shutter movements requires a large consumption of power.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Disclosed embodiments include a time-of-flight imaging system having a light source and a time-of-flight camera. The light source includes a plurality of P-N junctions in electrical series. The P-N junctions have an active emitter width of 100 microns or greater and an active emitter length of 500 microns or greater. The light source is configured to produce a pulse of output light in a first wavelength range. The time-of-flight camera includes an imaging sensor and a time measurement device. The imaging sensor is configured to receive light in the first wavelength range. The time measurement device is configured to measure the time-of-flight of the pulse of output light to the imaging sensor.

Disclosed embodiments also include methods for performing time-of-flight imaging by emitting a light pulse with a broad area multi junction laser diode, detecting an incoming light including a reflected light pulse with an imaging sensor; and measuring an elapsed time-of-flight between emitting the broad area light pulse and detecting the reflected light pulse.

Disclosed embodiments also include a time-of-flight imaging system configured with a broad area multi junction laser diode and a time-of-flight camera, wherein the multi junction laser diode includes a resonance cavity with a cavity width of 100 microns or greater and a cavity length of 500 microns or greater. The multi junction laser diode is specifically configured to produce a pulse of output light in a first wavelength range. The time-of-flight camera includes an imaging sensor, a pulse coordination device, a band-pass filter, and a time measurement device. The imaging sensor is configured to receive light in the first wavelength range. The pulse coordination device is configured to temporally coordinate the pulse of output light from the multi junction laser diode and an exposure of light through the use of an electronic shutter system to the plurality of pixels with a duration of the pulse of output light. The band-pass filter is configured to pass a second wavelength range to the imaging sensor. The first wavelength range and second wavelength range at least partially overlap. The time measurement device is configured to measure the time-of-flight of the pulse of output light to the imaging sensor.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments that are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that these drawings depict only typical embodiments and are not therefore to be considered to be limiting in scope, embodiments will be described and explained with additional specificity and detail through the use of the accompanying drawings in which:

FIG. 3-1 is a side cross-sectional view of an embodiment of a multi-junction laser diode;

FIG. 3-2 is a side cross-sectional view of another embodiment of a multi-junction laser diode;

FIG. 4-1 is a perspective view of an embodiment of a resonating cavity of a laser diode FIG. 4-2 is an end view of an embodiment of laser diode with parallel resonating cavities;

DETAILED DESCRIPTION

Figure 1:
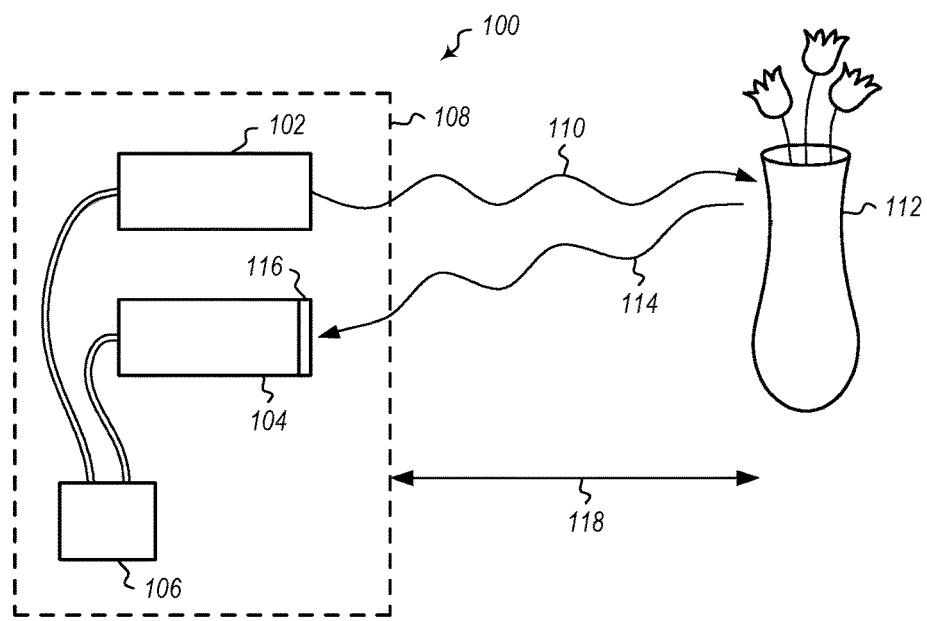
FIG. 1 is a schematic representation of an embodiment of a Time of Flight three-dimensional imaging system imaging an object.

Disclosed embodiments include devices, systems, and methods for improving efficiency in time of flight (TOF) three-dimensional (3D) imaging. Various embodiments of the disclosed devices, systems, and methods will now be provided.

With regard to the following disclosure, it will be appreciated that in the development of the disclosed embodiment(s), as in any engineering or design project, numerous embodiment-specific decisions will be made to achieve the developers' specific goals, such as compliance with system-related and business-related constraints, which may vary from one embodiment to another. It should further be appreciated that such a development effort might be complex and time consuming, but would nevertheless be a routine undertaking of design, fabrication, and manufacture for those of ordinary skill having the benefit of this disclosure.

The accuracy by which a target and/or an environment is imaged with a 3D imaging system may be at least partially related to ratio of reflected light (light emitted from the imaging system and reflected back to the imaging system) and ambient light captured by imaging system. The reflected light captured may be increased by increasing the intensity of the emitted light. The ambient light captured may be limited by reducing the exposure time of the imaging system.

A TOF 3D imaging system images an environment by reflecting an emitted broad beam light pulse off the environment and using a plurality of exposures to an imaging sensor to visualize different fields of depth in the environment. For example, the TOF 3D imaging system may construct a 3D image of an environment by pulsing a light source and an imaging sensor to layer images at different distances to build a single frame. This process is energy intensive; requiring many pulses and many exposures.

Energy consumption of a TOF 3D imaging system is related to the number of pulses and the associated exposures for the pulses (approximately 1/[laser output power]). Therefore, increasing the output power of the light source of the TOF 3D imaging system may allow the use of fewer pulses and fewer actuations of the electrical shutter, thereby consuming less energy.

Conventionally, increasing the intensity of the emitted light is accomplished by increasing the amperage of the input current to the light source, such as a laser diode. The light source converts the electrical current to light. The increased amperage yields an associated increase in wattage of the emitted light. The increased amperage also increased the heat generated by the light source and, hence, the power dissipated by the light source. The increased optical power density may also damage the light source through catastrophic optical damage or due to gradual degradation (wear-out) mechanisms.

A TOF 3D imaging system including a specialized light source according to the present disclosure may conserve energy and increase operational lifetime relative to a conventional TOF 3D imaging system by increasing the efficiency of the light source and shortening the duration of light pulses during 3D imaging.

In some embodiments, the specialized light source is a multi junction laser diode having at least two P-N junctions connected electrically in series in the laser diode. In at least one embodiment, the multi junction laser diode includes at least three junctions in the laser diode. In some embodiments, the configuration of the light source with one or more multi junction laser diode(s) allows the light source to have a differential quantum efficiency greater than 1 (meaning more than 1 photon is generated for every electron-hole pair recombination event), allowing an increase in wattage of the emitted light without a substantial increase in the amperage of the driving current. In at least one embodiment, the multi junction device is fabricated via epitaxial growth of a plurality of P-N junctions on the GaAs substrate. In at least one other embodiment, multiple laser devices are connected electrically in series at the singulated die level.

FIG. 1 illustrates a schematic representation of one embodiment of a TOF 3D imaging system 100 that includes a light source 102, an imaging sensor 104, and a pulse coordination device 106. In some embodiments, two or more components of the 3D imaging system 100 are contained within a single housing 108. For example, FIG. 1 depicts the light source 102 (including a laser light source, collimating optics, and a beam conditioner/diffuser; the laser light source can be a multi junction laser diode), an imaging sensor 104, and a pulse coordination device 106, which are all incorporated on a single support frame (i.e., a single board) and/or in a single housing 108.

In other embodiments, one or more components of the TOF 3D imaging system 100 are physically distributed and located separately from the housing 108 or at least on different sides/locations of the housing. For example, in some alternative embodiments, the light source 102 and imaging sensor 104 are located within the housing 108 and the pulse coordination device 106 is located outside of the housing 108. In another example, the housing 108 is a handheld device containing the light source 102 and the imaging sensor 104, while the pulse coordination device 106 is contained in a second housing or another device. In at least one example, the TOF camera may be in a first housing 108, and the first housing 108 may be integrated into a second housing.

The housing 108 may be a handheld portable housing and/or a housing mounted at stationary or fixed location. In some instances, the housing 108 is attached to or integrated into the housing for a vehicle, a robotic device, a handheld device, a portable device, (e.g., a laptop), a wearable device (e.g., a head-mounted device), or another device. The housing 108 may further contain other elements, such as a power source, battery, supporting electronics (i.e. power supplies), CPU or ASICs for supporting depth computation, a communication device, a storage device, and other components.

The light source 102 is configured to emit an output light 110. In some embodiments, the light source 102 is a laser source. For example, the light source 102 includes a multi junction (or set of series-connected individual emitters) laser diode attached to a high speed pulse switching electronics, power source and controller and that is thereby configured to produce the output light 110. In some embodiments, the light source 102 includes a plurality of laser light sources, such as a plurality of multi junction laser diodes on a single die or a plurality of independent multi junction laser diodes, or a plurality of single emitter laser diodes connected in series. The plurality of laser diodes, in such embodiments, are configured to each provide output light intensities and wavelengths that are equivalent. In other embodiments, the laser diodes may provide output light of different intensities and/or wavelengths.

In some embodiments, the output light 110 has a first wavelength range of less than about 100 nm. For example, the output light 110 may be emitted from the light source 102 with a spectral width in a first wavelength range less than 100 nanometers (nm), less than 80 nm, less than 60 nm, less than 40 nm, less than 20 nm, less than 10 nm, less than 5 nm, or any values therebetween. For example, the first wavelength range may be less than 50 nm.

In some embodiments, the output light 110 may also be at least partially in the infrared portion of the light spectrum (i.e., 800 nm to 1000 nm). For example, the output light 110 may have a first wavelength range of 800 nm to 900 nm. In other examples, the output light 110 may have a first wavelength range of 850 nm to 900 nm. In yet other example, the output light 110 may have a first wavelength range of 825 nm to 850 nm.

The projected or emitted output light 110 is directed towards a target (such as target 112 or other object) in the environment surrounding the TOF 3D imaging system 100. The TOF 3D imaging system 100 uses a time-of-flight camera ("TOF camera") to detect the reflected portion of the output light 110 and measure the elapsed time-of-flight of the light pulse from the light source 102 to the target 112 and to the imaging sensor 104. The TOF camera includes the imaging sensor 104 and a time-measurement device.

The imaging sensor 104 detects the arrival of an incoming light 114. The incoming light 114 that is received by the imaging system 100 may include at least some of the output light 110 that is reflected off the target 112. The incoming light 114 may also include ambient light from the surrounding environment. As the incoming light 114 approaches the imaging sensor 104, the imaging sensor 104 detects at least some of the incoming light 114.

In some embodiments, the imaging sensor 104 is configured with a plurality of pixels to detect and image a light pattern from the incoming light 114. In some embodiments, the imaging sensor 104 includes a charge-coupled device (CCD). In other embodiments, the imaging sensor 104 includes a complimentary metal-oxide semiconductor sensor array (CMOS).

The imaging sensor 104 is also configured with a shutter system 116 that exposes (or conversely, shutters) all of the pixels of the imaging sensor 104 simultaneously, and coordinates the timing between the pulsed illuminators and the imaging sensor.

The elapsed time-of-flight of an emitted pulse of the output light 110 (i.e., the time from emission of the output light 110 until the imaging sensor 104 detects the reflected output light 110 in the incoming light 114) allows the TOF 3D imaging system 100 to measure the distance 118 to the target 112. Increasing the proportion of the incoming light 114 that is directly attributed to the reflected output light 110 relative to the ambient light will increase the maximum range, accuracy and reliability of measurements of the TOF 3D imaging system 100.

Figure 2:
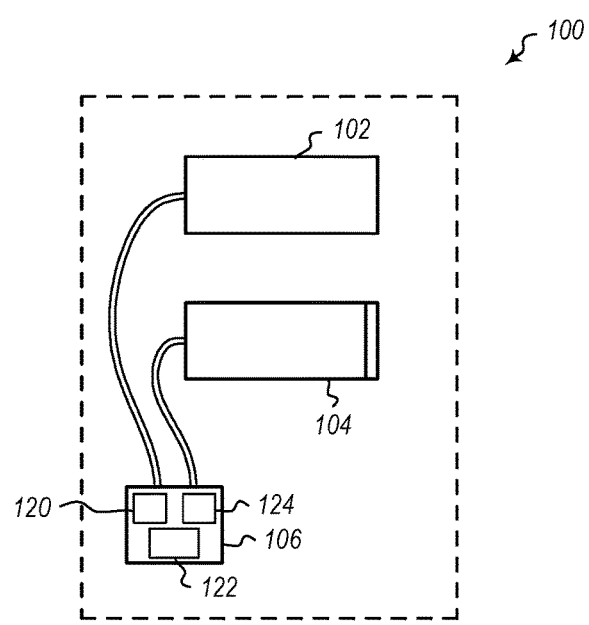
FIG. 2 is a schematic representation of the embodiment of a Time of Flight three-dimensional imaging system of FIG. 1.

In some embodiments, the emission of the output light 110 from the light source 102, the exposure of the imaging sensor 104 (via the shutter system 116), and the measurement of the elapsed time therebetween is at least partially controlled by the pulse coordination device 106 shown in FIG. 2.

As shown, the pulse coordination device 106 is linked (with one or more data communication channels) to the light source 102 and the imaging sensor 104. These data communication channels may include physical communication channels (i.e., using wires, cables, fiber optics, circuitry within a printed circuit board, etc.) and/or wireless communication channels (i.e., Wi-Fi, Bluetooth, etc.).

The pulse coordination device 106 includes a processor 120 and a data storage device 122 in communication with the processor 120. The pulse coordination device 106 may include a precision time measurement device coordinate the laser pulsing and the electronic shuttering of the sensor. The distance between the camera module and the target is calculated based on the accumulated signal at the sensor. TOF sensors make multiple measurements with different pulse to shutter ratios, and calculate depth based on the ratio between the measurements. The processor 120 (which may include one or more processors) is configured to control and coordinate the operation of the light source 102 and the imaging sensor 104. For example, the processor 120 may be configured to communicate one or more instructions to the light source 102 to emit an output light (e.g., output light 110 shown in FIG. 1) at a predetermined intensity for a period of time. In other examples, the processor 120 may be configured to communicate one or more instructions to the light source 102 to emit a modulated output light with a predetermined modulation pattern or amount for a period of time.

In some instances, the processor 120 is further configured to communicate one or more instructions to the imaging sensor 104 to coordinate exposure of the plurality of pixels of the imaging sensor 104 with the emission of the output light from the light source 102. In some embodiments, the processor 120 is configured to identify/compare one or more conditions of the light source 102 (i.e., intensity, wavelength, state of emission, etc.) to one or more conditions of the imaging sensor 104 (i.e., shutter status, gain, etc.). For example, the processor 120 is operable to identify when the light source 102 is emitting an output light, when the shutter system 116 of the imaging sensor 104 is open and when the plurality of pixels of the imaging sensor 104 are exposed.

In some embodiments, the pulse coordination device 106 may coordinate the operation of the light source 102 and the imaging sensor 104. For example, the pulse coordination device 106 opens the shutter system 116 of the imaging sensor 104 when the light source 102 begins emitting the output light. The pulse coordination device 106 also closes the shutter system 116 when the light source 102 stops emitting the output light. In some embodiments, the duration of the output light pulse and the exposure time of the imaging sensor 104 may be equivalent.

In gated TOF embodiments, the duration of the output light pulse and the exposure time of the imaging sensor 104 are equivalent, but the emission of the output light pulse and the exposure of the imaging sensor 104 are temporally offset, such that the shutter system opens before or after the start of the emission of the output light pulse. In yet other embodiments, the duration of the output light pulse may be greater than the exposure time of the imaging sensor 104. In further examples, the duration of the output light pulse may be less than the exposure time of the imaging sensor 104.

In phase modulated TOF embodiments, a TOF 3D imaging system uses different modulation frequencies to infer depth and to de-alias the frequency measurement. In such embodiments, the TOF camera may include a plurality of imaging sensors 104 and/or shutter systems 116. These systems may coordinate modulation of the broad area laser(s) and exposure of reflected light at the imaging sensor(s) 104 at a modulation frequency of between about 10 MHz and about 500 MHz.

The processor 120 communicates one or more instructions to the light source 102 and/or to the imaging sensor 104 based upon one or more detected conditions of the light source 102 and/or the imaging sensor 104. For example, the pulse coordination device 106 includes a data storage device 122 that is configured to store computer-executable instructions that, when run by the processor 120, allow the pulse coordination device 106 to instruct the light source 102 to emit output light and for the imaging sensor 104 to detect incoming light, sometimes simultaneously.

In some embodiments, the processor 120 coordinates the emission of the output light by the light source 102 and detection of the reflected portion of the output light in the incoming light by the imaging sensor 104 to measure the elapsed time-of-flight of the output light to the target and back (as shown in FIG. 1). The processor 120 may be in communication with and/or be a part of a time measurement device. The processor 120 may further utilize the elapsed time-of-flight and fixed speed of light to calculate the distance to the target.

In some embodiments, the data storage device 122 is configured to retain at least a portion of the data provided by the imaging sensor 104, including the one or more images of the detected light incoming light. Alternatively, or additionally, the data storage device 122 stores one or more data values associated with the incoming light, such as peak intensity, integration time, exposure time and/or other values.

The pulse coordination device 106 also includes a communication module 124, in some embodiments, to communicate the 3D imaging data from the processor 120 and/or data storage device 122 to one or more other computers and/or storage devices. For example, the communication module 124 may be configured to provide communication to another computing device via a physical data connection, such as wires, cables, fiber optics, circuitry within a printed circuit board, or other data conduit; via wireless data communication, such as WiFi, Bluetooth, cellular, or other wireless data protocols; removable media, such as optical media (CDs, DVDs, Blu-Ray discs, etc.), solid-state memory modules (RAM, ROM, EEPROM, etc.); or combinations thereof.

The elapsed time-of-flight for an emitted (and reflected) light pulse may be on the order of nanoseconds. Hence, precise measurement of the time at which the imaging sensor 104 receives and detects the light pulse is important to calculating the elapsed time-of-flight. Increasing the intensity of the light pulse relative to the ambient light intensity may increase the ability of the imaging sensor 104 to detect the light pulse.

Conventional single junction laser diodes having a power (i.e., output quantity of photons) according to:

$$P = QE_i \times QE_d (I - I_{threshold})$$

where $QE_i$ is the intrinsic quantum efficiency of the laser diode, $QE_d$ is the differential quantum efficiency of the laser diode, $I$ is the current, and $I_{loss}$ is the current loss in the device (therefore $I - I_{threshold}$ being the net current available to convert into photons). The intrinsic quantum efficiency is the rate at which the laser diode converts the electrons of the net current to photons. The differential quantum efficiency is the rate at which the generated photons are emitted from the laser diode in an output light. Power of a single junction laser diode, therefore, scales with net drive current.

Figures 1, 3:
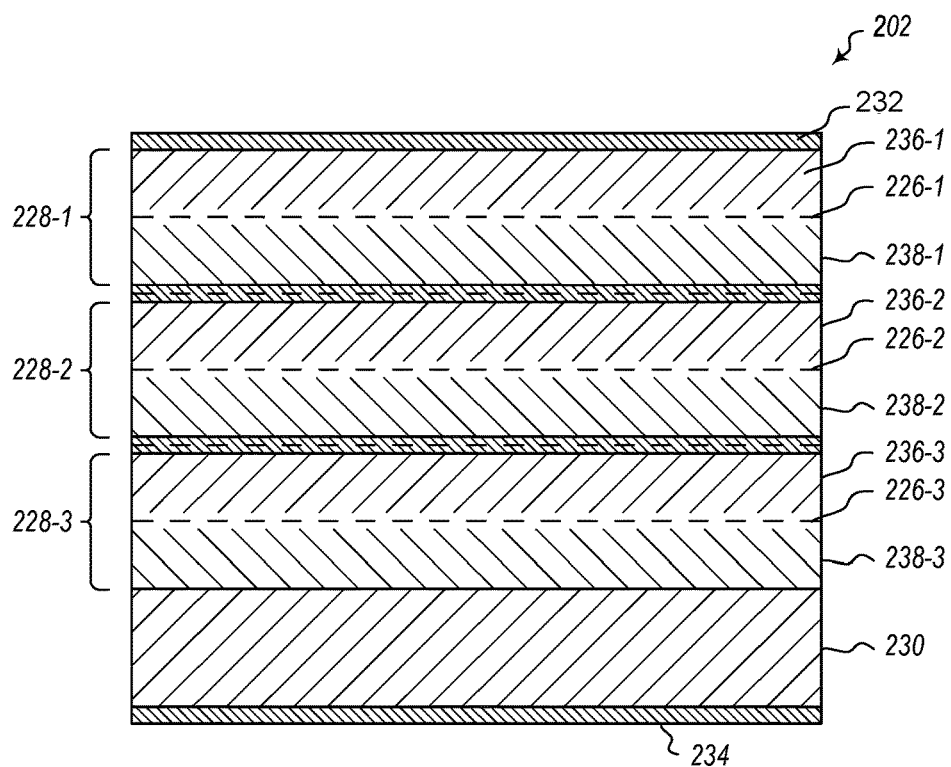
Figures 2, 3:
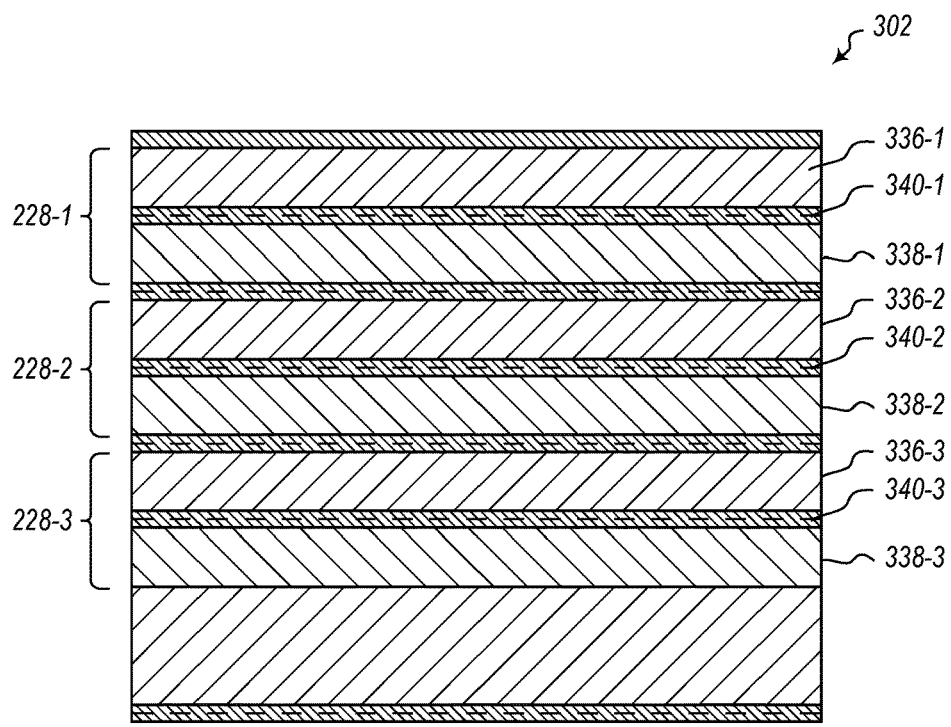

Some of the disclosed specialized light sources used for the TOF system includes multi junction laser diodes, such as the light source 202 shown in FIG. 3-1, and which are configured with a plurality of P-N junctions 226-1, 226-2, 226-3, each defining a laser resonant cavity. The light source 202 depicted in FIG. 3 is a triple junction laser diode consisting of three electrical P-N junctions defining three resonant laser cavities all connected electrically in series, but in other embodiments, the light source 202 may have more or less junctions. For example, some laser diodes may have 2, 4, 5, 6, 7, 8, or more junctions.

Each of the junctions 226-1, 226-2, 226-3 is a division between parts of a cell 228-1, 228-2, 228-3 within the light source 202. For example, a first cell 228-1 includes a first P-N junction 226-1 defining a laser cavity, followed by a "tunnel junction" for series connection of the P-N junction pairs. The second cell 228-2 includes the second junction 226-2 with associated tunnel junction. The third cell 228-3 includes the third junction 226-3.

The laser diode of the light source 202 may be grown upon, deposited on, or otherwise be in contact with a substrate 230. For example, the cells 228-1, 228-2, 228-3 may form strata upon the substrate 230. In some embodiments, the substrate 230 includes a semiconducting material, such as gallium arsenide, gallium nitride, indium gallium arsenide, Indium Phosphide, or other semiconducting materials. The laser diode includes a first contact material 232 and a second contact material 234 at opposing ends of the strata of cells 228-1, 228-2, 228-3 and the substrate 230. For example, a first contact material 232 may be in contact with a surface of the first cell 228-1 and provide electrical communication or conductivity therewith. The second contact material may be positioned in contact with a surface of the substrate and opposite the first contact material 232.

Each cell 228-1, 228-2, 228-3 includes a p-type material 236-1, 236-2, 236-3 and an n-type material 238-1, 238-2, 238-3. The junctions 226-1, 226-2, 226-3 are the locations at which the p-type material 236-1, 236-2, 236-3 and the n-type material 238-1, 238-2, 238-3 of each cell 228-1, 228-2, 228-3 contact. The region at and around a junction (for example, the first junction 226-1) may include a plurality of electron-hole pairs that, once migrated in contact with one another, produce a photon.

In other embodiments, the p-type material 236-1, 236-2, 236-3 and the n-type material 238-1, 238-2, 238-3 may not directly contact one another, but rather have an additional material positioned therebetween to form a heterojunction barrier and a quantum well.

In yet other embodiments, the p-type material 236-1, 236-2, 236-3 and the n-type material 238-1, 238-2, 238-3 may each comprise more than one material in the strata. For example, the first cell 228-1 may be a double heterostructure laser diode with a plurality of first p-type materials 236-1 and a plurality of first n-type materials 238-1 to further concentrate the electron-hole pairs.

FIG. 3-2 illustrates an embodiment of a separate confinement heterostructure laser diode 302 having a plurality of junctions. The cells 328-1, 328-2, 328-3 may include a plurality of p-type materials 336-1, 336-2, 336-3 and a plurality of n-type materials 338-1, 338-2, 338-3 and an additional material positioned therebetween to form a quantum well (e.g., quantum wells 340-1, 340-2, and 340-3).

Figures 1, 4:
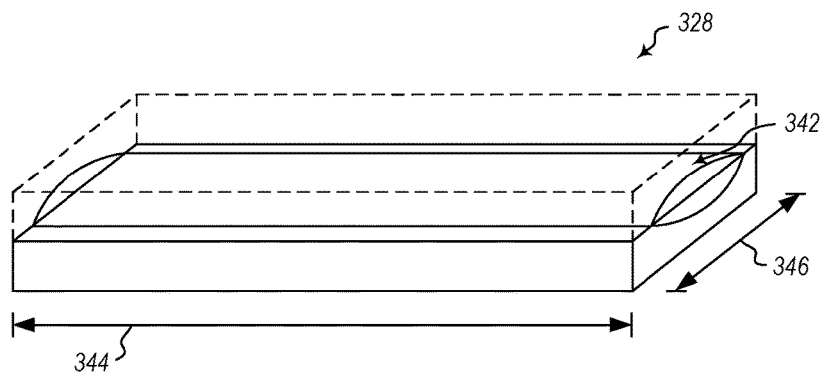
Figures 2, 4:
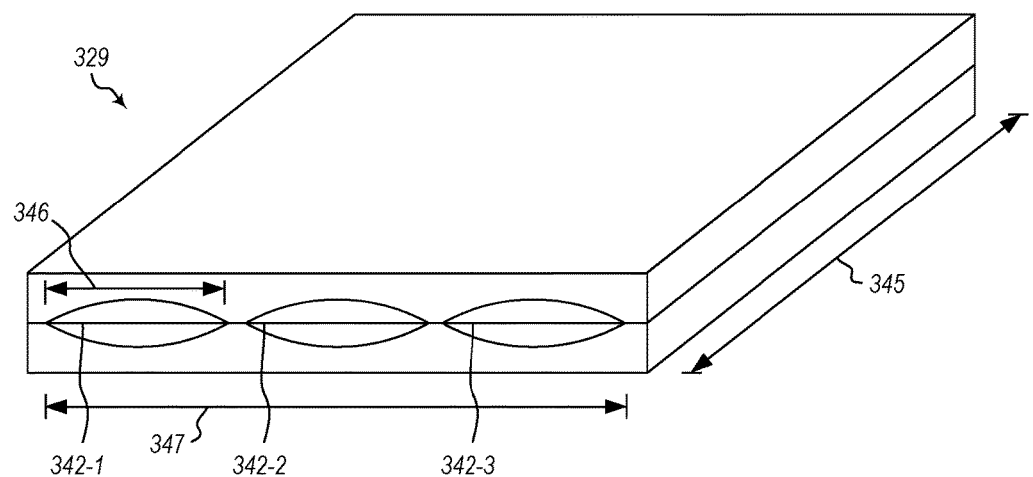

FIG. 4-1 illustrates a perspective view of an embodiment of a cell 328 to show the resonance cavity 342 of the laser diode. The cavity 342 is the region in which the photons generated by the laser diode are confined and in which the photons resonate before emission. The cavity 342 may support a single optical mode of the photons or multiple optical modes. A laser diode having a cavity 342 that supports multiple optical modes is known as a multimode laser.

The dimensions of the cavity 342 may affect the power dissipation of the laser diode. For example, a cavity having an increased length may reduce the dissipated power through reduced resistance and corresponding improved efficiency, allowing for a higher power output with less power lost in the emission of the output light pulse. Additionally the larger footprint improves the thermal heatsinking capability of the device, thus enabling higher power operation through improved thermal dissipation. With increased power dissipation, more of the input energy is converted to thermal energy, and the laser diode may experience thermal degradation in output power. Reducing one or more of the dimensions of the cavity 342 may increase thermal resistance of the device, and the accompanying degradation. Increasing one or more of the dimensions of the cavity 342 may reduce the efficiency of the laser diode.

In some embodiments, a cavity 342 according to the present disclosure may have a width 346 in a range having an upper value, a lower value, or upper and lower values including any of 100 µm, 200 µm, 300 µm, 400 µm, 500 µm, 600 µm, or any values therebetween. For example, the cavity 342 may have a width 346 greater than 100 µm. In another example, the cavity 342 may have a width 346 between 100 µm and 500 µm. In yet another example, the cavity 342 may have a width 346 between 100 µm and 400 µm.

In some embodiments, a cavity 342 according to the present disclosure may have a length 344 in a range having an upper value, a lower value, or upper and lower values including any of 500 µm, 600 µm, 700 µm, 800 µm, 900 µm, 1000 µm, 1100 µm, 1200 µm, or any values therebetween. For example, the cavity 342 may have a length 344 greater than 500 µm. In another example, the cavity 342 may have a length 344 between 500 µm and 1200 µm. In yet another example, the cavity 342 may have a length 344 between 600 µm and 900 µm.

FIG. 4-2 illustrates an embodiment of a laser diode 329 having a plurality of resonating cavities 342-1, 342-2, 342-3 in parallel. The resonating cavities 342-1, 342-2, 342-3 each have a cavity width 346 and a cavity length. The resonating cavities 342-1, 342-2, 342-3 may operate in conjunction with one another to define an active emitter. The cavity length of the resonating cavities 342-1, 342-2, 342-3 defines an active emitter length 345. For example, the sum of the cavity widths of the resonating cavities 342-1, 342-2, 342-3 in parallel defines an active emitter width 347. A potential applied over the laser diode 329 as a whole will allow emission of photons from each of the resonating cavities 342-1, 342-2, 342-3.

In some embodiments, the active emitter length 345 may be in a range having an upper value, a lower value, or an upper and lower value including any of 500 µm, 600 µm, 700 µm, 800 µm, 900 µm, 1000 µm, 1100 µm, 1200 µm, 1500 µm, 2000 µm, 2500 µm, 3000 µm, 3500 µm, 4000 µm, or any values therebetween. For example, the active emitter length 345 may be greater than 500 µm. In another example, the active emitter length 345 may be between 500 µm and 4000 µm. In yet another example, the active emitter length 345 may be between 600 µm and 1200 µm. A potential applied over the laser diode 329 as a whole will allow emission of photons from each of the resonating cavities 342-1, 342-2, 342-3.

In some embodiments, the active emitter width 347 may be in a range having an upper value, a lower value, or an upper and lower value including any of 100 µm, 200 µm, 300 µm, 400 µm, 500 µm, 600 µm, 700 µm, 800 µm, 900 µm, 1000 µm, or any values therebetween. For example, the active emitter width 347 may be greater than 100 µm. In another example, the active emitter width 347 may be between 100 µm and 1000 µm. In yet another example, the active emitter width 347 may be between 100 µm and 600 µm.

Figure 5:
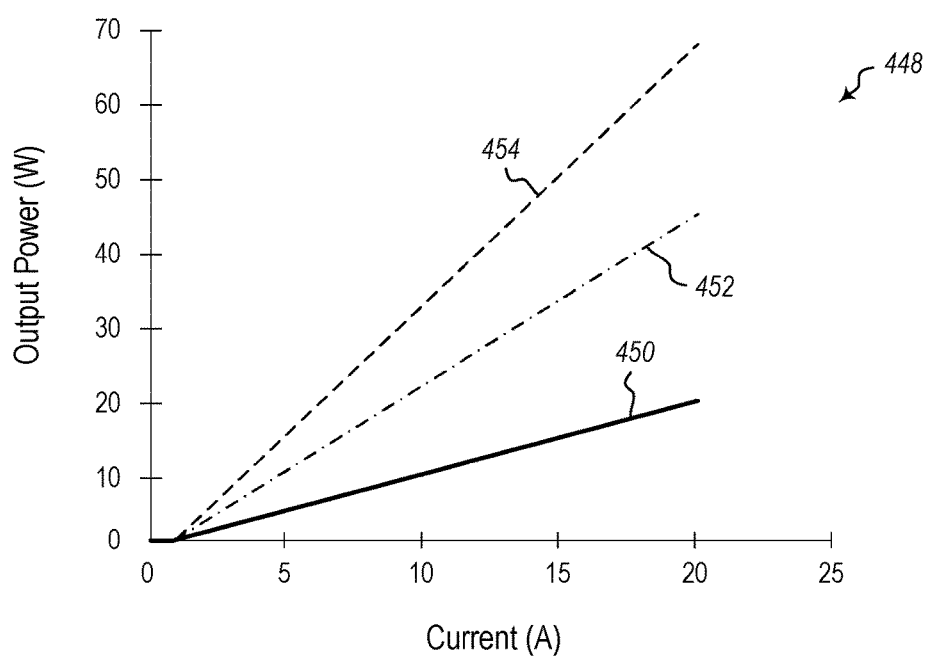
FIG. 5 is a chart illustrating embodiments of slope efficiencies of various laser diodes.

FIG. 5 illustrates slope efficiencies of various embodiments of laser diodes operated in a pulsed mode. The chart illustrates a single junction slope efficiency 450, a double-junction slope efficiency 452, and a triple-junction slope efficiency 454. The single-junction slope efficiency 450 reflects the efficiency of an embodiment of a conventional single-junction laser diode at converting a current to output power. Similarly, the double-junction slope efficiency 452 and triple-junction slope efficiency 454 reflect the efficiency of an embodiment of a double-junction laser diode and triple-junction laser diode, respectively, at converting a current to output wattage.

The single-junction slope efficiency 450 illustrates an approximate 1:1 relationship of output power to drive current. The single-junction slope efficiency 450 may experience some reduction in the efficiency as the current continues to increase, as higher currents may raise the temperature of the laser diode and more power is dissipated at the higher currents through the diode. In particular, increased drive currents may increase latency within the system, reducing the rate at which the system may be pulsed.

The double-junction slope efficiency 452 illustrates an approximate 2:1 relationship of output power to drive current. A double-junction laser diode exhibits approximately double the output power of a conventional single-junction laser diode for a given current. However, a double-junction laser diode requires an associated increase in voltage across the laser diode. For example, compared to an equivalent output power of a single-junction laser diode, the voltage across a double-junction laser diode is approximately doubled while the current is approximately halved.

The triple-junction slope efficiency 454 illustrates an approximate 3:1 relationship of output power to drive current. A triple-junction laser diode exhibits approximately triple the efficiency of a conventional single junction laser diode for a given current. However, the triple-junction laser diode requires an associated increase in voltage across the laser diode, similarly to the double-junction laser diode. The triple junction laser diode, therefore, is operated with a higher voltage, but a much lower current, and therefore temperature compared to a single-junction laser diode. The lower current allows a triple-junction laser diode to operate in a TOF 3D imaging system at higher output powers with less inductive losses in the switching circuitry due to the lower required drive current. The other power savings comes from reduced number of laser pulses required to achieve the required SNR of the camera system.

Figure 6:
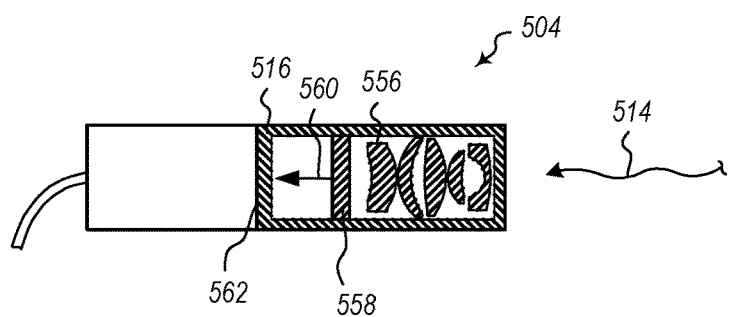
FIG. 6 is a side partial cross-sectional view of an embodiment of an imaging sensor.

FIG. 6 illustrates an embodiment of an imaging sensor 504. The imaging sensor 504 may include one or more optical elements (such as lenses 556) to direct incoming light 514 through the imaging sensor 504. The imaging sensor may limit the portion of the incoming light received by the plurality of pixels at a receiving end 562 of the imaging sensor 504 by filtering at least some of the ambient light from the incoming light 514. The imaging sensor 504 has a detection wavelength range that is much larger than the first wavelength range (emission wavelength range). For example, the first wavelength range may be about 5 nm and the detection wavelength range may be about greater than 300 nm.

In some embodiments, a bandpass filter 558 is used to pass a filtered light 560 with a second wavelength range by filtering the incoming light 514 in such a way as to block light outside of the second wavelength range. The ambient light may have a broad spectrum from the sun, lamps, electronic displays, and other sources that may be broader than and include the emission spectrum of the light source. The incoming light may be a mix of ambient light and the reflected output light. For example, the bandpass filter 558 may pass light in a second wavelength range less than 100 nm, less than 80 nm, less than 60 nm, less than 40 nm, less than 20 nm, less than 10 nm, less than 5 nm, or any values therebetween, while filtering/blocking out other spectra of the incoming light 514. In some instances, the second wavelength range of light that is allowed to pass to the plurality of pixels at a receiving end 562 of the imaging sensor 504 is less than 50 nm.

The first wavelength range and the second wavelength range at least partially overlap. By way of example, the first wavelength range may have a width greater than a width of the second wavelength range. Even more particularly, the first wavelength range may be 750 nm to 850 nm, and the second wavelength range may be 800 nm to 875 nm. In other embodiments, the first wavelength range may have a width less than a width of the second wavelength range. For example, the first wavelength range may be 750 nm to 800 nm, and the second wavelength range may be 750 nm to 770 nm. In yet other embodiments, the first wavelength range may have a width equal to a width of the second wavelength range. For example, the first wavelength range may be 750 nm to 800 nm, and the second wavelength range may be 770 nm to 820 nm. In at least one embodiment, the first wavelength range may be the same as the second wavelength range. For example, the first wavelength range may be 750 nm to 800 nm, and the second wavelength range may be 750 nm to 800 nm.

The bandpass filter 558 is configured to pass the filtered light 560 to the receiving end 562 of the imaging sensor 504. In some instances, the bandpass filter 558 is positioned directly at the receiving end 562 of the imaging sensor 504, such as directly adjacent to the receiving end 562 of the imaging sensor 504. In other embodiments, one or more optical elements (e.g., lenses 556, filters, capillaries, etc.) are interposed between the bandpass filter 558 and the receiving end 562 of the imaging sensor 504.

A shutter system 516 controls the exposure of the plurality of pixels at the receiving end 562 of the imaging sensor 504 to the filtered light 518, as previously disclosed. The bandpass filter 558 is also configured to pass filtered light 560 in a second wavelength range of light that is at least partially overlapping with a first wavelength range of the output light. The filtering of the incoming light 514 with the bandpass filter 558 reduces the amount of ambient light that may contribute to the light received at the plurality of pixels of the imaging sensor 504, improving a signal-to-noise ratio.

Figure 7:
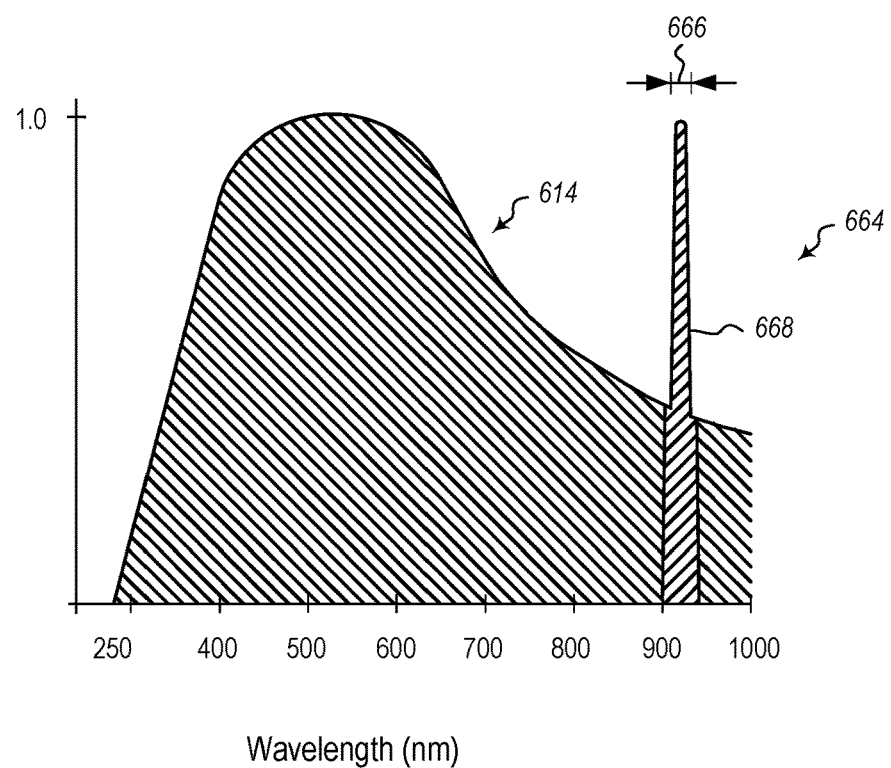
FIG. 7 is a chart schematically illustrating the effect of the bandpass filter of FIG. 6.

The shutter system 516 may be configured to shutter or otherwise prevent exposure of the plurality of pixels substantially simultaneously. In some embodiments, the shutter system 516 may have a rise and fall time of less than 1 ns. In other embodiments, the shutter system 516 may have a rise and fall time with 1 ns and 500 ns FIG. 7 is a graph 664 representing an embodiment of a bandpass filter filtering incoming light 614 down to filtered light 668. The filtered light 668 is the portion of the incoming light 614 that is passed to the pixels of the imaging sensor. The spectrum of the incoming light 614 includes ambient light (approximated as sunlight in FIG. 7) that comprises the majority of the spectrum, with a peak within the first wavelength range that corresponds to the output light emitted by the light source. The bandpass filter may transmit or pass the majority of the light within a second wavelength range 666 (i.e., the bandwidth of the bandpass filter) and attenuate light elsewhere in the spectrum to pass the comparatively narrow spectrum of the filtered light 668 to the imaging sensor.

Figure 8:
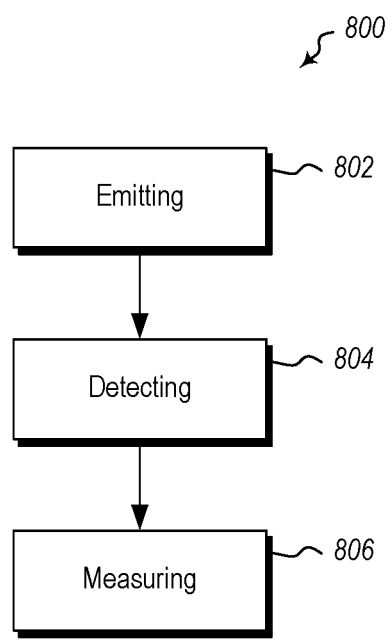
FIG. 8 is a flowchart depicting an embodiment of a method of three-dimensional imaging.

FIG. 8 illustrates an embodiment of a flowchart 800 that includes various acts associated with the disclosed methods for operating a TOF 3D imaging system having a laser diode, such as the disclosed multi junction laser diode(s). The illustrated acts include emitting 802 one or more intermittent pulses of output light from a laser diode (such as the disclosed one or more multi junction laser diode(s)) within a first wavelength range, wherein the one or more intermittent pulses have a predetermined pulse time. The first wavelength range has a width of less than 100 nm, less than 80 nm, less than 60 nm, less than 40 nm, less than 20 nm, less than 10 nm, less than 5 nm, or any values therebetween. For example, the first wavelength range may be 700 nm to 800 nm. In other examples, the first wavelength range may be 750 nm to 800 nm. In yet other example, first wavelength range may be 825 nm to 850 nm.

In some embodiments, the pulse of output light has a duration less than 5 ns, less than 10 ns, less than 15 ns, less than 20 ns, less than 25 ns, less than 30 ns, less than 40 ns, less than 50 ns, less than 60 ns, less than 70 ns, less than 80 ns, less than 90 ns, less than 100 ns, or any values therebetween. In a phase-modulated embodiment, a modulation frequency can vary between an upper value and a lower value between 10 MHz and 500 MHz.

In some embodiments, the pulse of output light may have a peak intensity of greater than 10 W, greater than 15 W, greater than 20 W, greater than 25 W, greater than 30 W, greater than 35 W, greater than 40 W, greater than 50 W, greater than 60 W, greater than 70 W, greater than 80 W, greater than 90 W, greater than 100 W, or any values therebetween for single 200 nm wide active emitter width. Diode lasers with active emitter widths scale power approximately with the active emitter width.

The disclosed acts also include detecting 804 an incoming light. This incoming light may include a reflected portion of the output light that is passed through a band-pass filter. The band-pass filter may filter the incoming light and pass a filtered light in a second wavelength range. For example, the bandpass filter 558 may pass light in a second wavelength range less than 100 nm, less than 80 nm, less than 60 nm, less than 40 nm, less than 20 nm, less than 10 nm, less than 5 nm, or any values therebetween, while attenuating out other spectra of the incoming light.

The filtered incoming light is then exposed to a plurality of pixels of an imaging sensor for an exposure time having a duration at least the predetermined pulse time and, in some instances, less than 5 ns to 100 μs. The shuttering system may expose the plurality of pixels to the incoming light multiple times for each pulse of light emitted from the light source. In other embodiments, the shuttering system may expose the plurality of pixels to the incoming light once.

The relative amount of time that the shutter is open and the plurality of pixels is exposed to light may be related to the emitting 802 of the light. In other words, the amount of time that the shutter is open may be related to a duty cycle of the light source. In some embodiments, the duty cycle of the light source may be approximately 50%. In other embodiments, the duty cycle may be less than 50%, less than 40%, less than 30%, less than 20%, or less than 10%.

The disclosed acts further include measuring 806 the elapsed time-of-flight between emitting the one or more intermittent pulses of output light and detecting the incoming light. A time-measurement device may receive time information from the imaging sensor upon detecting 804 the incoming light. The time-measurement device may compare the time information from the imaging sensor against a time of emission. The time of emission may be the time that the pulse of output light is emitted by the light source.

In some embodiments, the time-measurement device may be a precision timing ASIC, a FPGA, or a processor, such as processor 120 described in relation to FIG. 2. In other embodiments, the time-measurement device may be in data communication with the processor. In other embodiments, the precision timing device can be incorporated onto the imaging sensor. In some embodiments, the time of emission may be provided by the light source. In other embodiments, the time of emission may be the time at which the processor instructs the light source to emit a pulse of output light.

The disclosed TOF 3D imaging systems may increase signal to noise ratio by increasing output power and limiting the exposure of the imaging sensor to ambient light. In at least one embodiment, a TOF 3D imaging system of the present disclosure may consume less energy than a conventional TOF 3D imaging system with a single junction laser diode.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A time-of-flight imaging system, the system comprising:
a light source having a plurality of P-N junctions in electrical series, the P-N junctions of the plurality of P-N junctions having an active emitter width of about 100 microns or greater and an active emitter length of about 500 microns or greater, the plurality of P-N junctions configured to produce a pulse of output light in a first wavelength range; and
a time-of-flight camera including:
an imaging sensor configured to receive light in the first wavelength range, and
a time measurement device configured to measure the time-of-flight of the pulse of output light to the imaging sensor.

2. The system of claim 1, wherein the plurality of P-N junctions is in a triple-junction laser diode.

3. The system of claim 1, wherein the plurality of P-N junctions are multimode laser diodes.

4. The system of claim 1, wherein the active emitter length is in a range of 500 microns to 4000 microns.

5. The system of claim 1, wherein the active emitter width is in a range of 100 microns to 1000 microns.

6. The system of claim 1, further comprising an infrared band-pass filter positioned in series with the imaging sensor to filter out ambient light.

7. The system of claim 1, wherein the plurality of P-N junctions has a peak output power of 5 watts or greater.

8. The system of claim 1, wherein the plurality of P-N junctions has a slope efficiency of 2.0 Watts/Amp or greater.

9. The system of claim 1, wherein the plurality of P-N junctions further comprises a plurality of laser diodes on a substrate.

10. A method of time-of-flight imaging, the method comprising:
- emitting a broad area light pulse with a broad area multi junction laser diode, wherein the multi junction laser diode includes an active emitter having a length of about 500 microns or greater;
- detecting an incoming light including a reflected light pulse with an imaging sensor; and
- measuring an elapsed time-of-flight between emitting the broad area light pulse and detecting the reflected light pulse.

11. The method of claim 10, wherein the broad area light pulse has a pulse time of less than 10 nanoseconds.

12. The method of claim 10, wherein the broad area light pulse has a peak intensity of 5 watts or greater.

13. The method of claim 10, wherein detecting the reflected light pulse includes using a plurality of pixels.

14. The method of claim 10, further comprising coordinating the emitting and the detecting such that detecting the incoming light has an exposure time equivalent to a duration of the broad area light pulse.

15. The method of claim 14, wherein coordinating the emitting and detecting includes controlling a shutter system of the imaging sensor.

16. The method of claim 15, wherein the method further includes at least one of:
- a start of the exposure time being offset from a start of a duration of the broad area light pulse, or
- the broad area pulse and exposure at an imaging sensor of the reflected light pulse being modulated in coordination with a modulation frequency of between 10 and 500 MHz.

17. The method of claim 10, wherein detecting the reflected light pulse has an exposure time of 50 nanoseconds or less.

18. A time-of-flight imaging system, the system comprising:
- a multi junction laser light source having an active emitter width of about 100 microns or greater and an active emitter length of about 500 microns or greater, the multi-junction laser light source configured to produce a pulse of output light in a first wavelength range; and
- a time-of-flight camera, the time-of-flight camera including:
  - an imaging sensor having a plurality of pixels and a shutter system to selectively allow an exposure of light to the plurality of pixels, the shutter system having a rise and fall time of at least 1 nanosecond,
  - a pulse coordination device configured to temporally coordinate the pulse of output light from the multi junction laser diode and an exposure of light to the plurality of pixels with a duration of the pulse of output light,
  - a band-pass filter, the band-pass filter configured to pass a second wavelength range to the imaging sensor, the first wavelength range and second wavelength range at least partially overlapping, and
  - a time measurement device configured to measure an elapsed time-of-flight of the pulse of output light to the imaging sensor.

19. The system of claim 18, wherein the imaging sensor is selected from a group consisting of a charge coupled device and a complimentary metal-oxide semiconductor.

20. The system of claim 18, wherein the active emitter length is 500 microns.

* * * * *